(12) United States Patent
Prall (10) Patent No.: US 7,112,815 B2
(45) Date of Patent: Sep. 26, 2006

(54) MULTI-LAYER MEMORY ARRAYS

(75) Inventor: Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 163 days.

(21) Appl. No.: 10/786,765

(22) Filed: Feb. 25, 2004

(65) Prior Publication Data

US 2005/0184329 A1    Aug. 25, 2005

(51) Int. Cl.
*H01L 47/00* (2006.01)
(52) U.S. Cl. ............................ 257/2; 257/5; 257/315
(58) Field of Classification Search .................... 257/2, 257/3, 4, 5, 314–316; 438/95; 365/66, 185.01, 365/185.13, 185.26
See application file for complete search history.

(56) References Cited

U.S. PATENT DOCUMENTS

| | | | |
|---|---|---|---|
| 5,091,762 | A | 2/1992 | Watanabe |
| 6,034,882 | A | 3/2000 | Johnson et al. |
| 6,377,504 | B1 | 4/2002 | Hilbert |
| 6,636,442 | B1 * | 10/2003 | Rowlandson et al. .. 365/185.28 |
| 6,657,250 | B1 | 12/2003 | Rudeck |
| 6,735,104 | B1 | 5/2004 | Scheuerlein |
| 6,822,903 | B1 | 11/2004 | Scheuerlein et al. |
| 6,937,248 | B1 * | 8/2005 | Edwards et al. ............. 345/571 |
| 2002/0079520 | A1 | 6/2002 | Nishihara |
| 2003/0132458 | A1 | 7/2003 | Van Brocklin |
| 2003/0214835 | A1 | 11/2003 | Nejad |
| 2003/0224535 | A1 | 12/2003 | Andideh |
| 2004/0003191 | A1 | 1/2004 | Minne |
| 2004/0026730 | A1 | 2/2004 | Kostylev |

FOREIGN PATENT DOCUMENTS

| | | |
|---|---|---|
| EP | 1 308 958 A2 | 5/2003 |
| EP | 1 318 522 A2 | 6/2003 |

OTHER PUBLICATIONS

S. Herner et al., "Vertical p-I-n Polysilicon Diode With Antifuse for Stackable Field-Programmable ROM," IEEE Electron Device Letters, vol. 25, No. 5, May 2004, pp. 271-273.
M. Johnson et al., "512-Mb PROM With a Three-Dimensional Array of Diode/Antifuse Memory Cells," IEEE Journal of Solid State Circuits, vol. 38, No. 11, Nov. 2003, pp. 1920-1928.
F. Li et al., "Evaluation of $SiO_2$ Antifuse in a 3D-OTP Memory," IEEE Transactions on Device and Materials Reliability, vol. 4, No. 3, Sep. 2004, pp. 416-421.

* cited by examiner

*Primary Examiner*—Hoai Pham
(74) *Attorney, Agent, or Firm*—Leffert Jay & Polglaze P.A.

(57) ABSTRACT

Multi-layer memory arrays and methods are provided. A memory array has two or more layers of memory material, each layer of memory material having an array of memory cells. A first contact penetrates through each layer of memory material in a first plane and is electrically connected to each layer of memory material so as to electrically interconnect the layers of memory material in the first plane. A second contact penetrates through at least one of the layers of memory material in a second plane substantially perpendicular to the first plane.

38 Claims, 6 Drawing Sheets

MULTI-LAYER MEMORY ARRAYS

TECHNICAL FIELD OF THE INVENTION

The present invention relates generally to memory arrays and in particular the present invention relates to multi-layer memory arrays.

BACKGROUND OF THE INVENTION

Memory devices are available in a variety of styles and sizes. Some memory devices are volatile in nature and cannot retain data without an active power supply. A typical volatile memory is a DRAM that includes memory cells formed as capacitors. A charge, or lack of charge, on the capacitors indicates a binary state of data stored in the memory cell. Dynamic memory devices require more effort to retain data than non-volatile memories, but are typically faster to read and write.

Non-volatile memory devices are also available in different configurations. For example, floating gate memory devices are non-volatile memories that use floating-gate transistors to store data. The data is written to the memory cells by changing a threshold voltage of the transistor and is retained when the power is removed. The transistors can be erased to restore the threshold voltage of the transistor. The memory may be arranged in erase blocks where all of the memory cells in an erase block are erased at one time. These non-volatile memory devices are commonly referred to as flash memories.

Flash memories may use floating gate technology or trapping technology. Floating gate cells include source and drain regions that are laterally spaced apart to form an intermediate channel region. The source and drain regions are formed in a common horizontal plane of a silicon substrate. The floating gate, typically made of doped polysilicon, is disposed over the channel region and is electrically isolated from the other cell elements by a dielectric. The non-volatile memory function for the floating gate technology is created by the absence or presence of charge stored on the isolated floating gate. The trapping technology functions as a non-volatile memory by the absence or presence of charge stored in isolated traps that capture and store electrons or holes.

NOR and NAND flash memory devices are two common types of flash memory devices, so called for the logical form the basic memory cell configuration in which each is arranged. Typically, for NOR flash memory devices, the control gate of each memory cell of a row of the array is connected to a word line, and the drain region of each memory cell of a column of the array is connected to a bit line. The memory array for NOR flash memory devices is accessed by a row decoder activating a row of floating gate memory cells by selecting the word line connected to their control gates. The row of selected memory cells then place their data values on the column bit lines by flowing a differing current, depending upon their programmed states, from a connected source line to the connected column bit lines.

The array of memory cells for NAND flash memory devices is also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

In order for memory manufacturers to remain competitive, memory designers are constantly trying to increase the density of memory devices. Increasing the density of a flash memory device generally requires reducing spacing between memory cells and/or making memory cells smaller. Smaller dimensions of many device elements may cause operational problems with the cell. For example, the channel between the source/drain regions becomes shorter, possibly causing severe short channel effects.

For the reasons stated above, and for other reasons stated below which will become apparent to those skilled in the art upon reading and understanding the present specification, there is a need in the art for higher density memory devices.

SUMMARY

The above-mentioned problems with increasing the density of memory devices and other problems are addressed by the present invention and will be understood by reading and studying the following specification.

For one embodiment, the invention provides a memory array with two or more layers of memory material, each layer of memory material having an array of memory cells. A first contact penetrates through each layer of memory material and is electrically connected to each layer of memory material so as to electrically interconnect the layers of memory material.

Another embodiment provides a memory array with a plurality of layers of memory material, each layer of memory material containing an array of memory cells arranged in rows and columns and each of the plurality of layers of memory material separated from each other by a dielectric material. A plurality of first contacts passes through each of the plurality of layers of memory material, each first contact in electrical communication with at least one memory cell of a column of memory cells in each of the plurality of layers of memory material. A plurality of second contacts passes through each of the plurality of layers of memory material, each second contact in selective electrical communication with a row of memory cells in each of the plurality of layers of memory material. Each of a plurality of first select transistors is connected between a second contact and its respective row of memory cells for providing selective electrical communication. The plurality of first select transistors is adapted to provide electrical communication with only one row of memory cells for each second contact.

Another embodiment provides a memory array with first and second layers of memory material, each of the first and second layers of memory material containing an array of memory cells arranged in rows and columns and the first and second layers of memory material separated from each other by a dielectric material. A plurality of first contacts passes through the first and second layers of memory material, each first contact in electrical communication with at least one memory cell of a column of memory cells in each of the first and second layers of memory material. A plurality of second contacts passes through the first layer of memory material, each second contact in selective electrical communication with a row of memory cells of the first layer of memory material. A plurality of third contacts passes through the second layer of memory material, each third contact in selective electrical communication with a row of memory cells of the second layer of memory material.

Another embodiment provides a method of forming a memory array that includes forming a stack of two or more layers of memory material on a substrate, each layer of memory material having an array of memory cells, and forming one or more contacts that pass through each of the layers of memory material.

A further embodiment provides a method of forming a memory array that includes forming a stack of two or more layers of memory material on a substrate, each layer of memory material having an array of memory cells and separated from another layer of memory material by a dielectric layer, forming a first contact that passes through each of the layers of memory material in a first plane to electrically interconnect the layers of memory material in the first plane, and forming a second contact that passes through at least one of the layers of memory material in a second plane that is substantially perpendicular to the first plane.

The invention further provides memory devices and electronic systems making use of such memory arrays. The invention still further provides methods and apparatus of varying scope.

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer or substrate, used in the following description, include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 1:
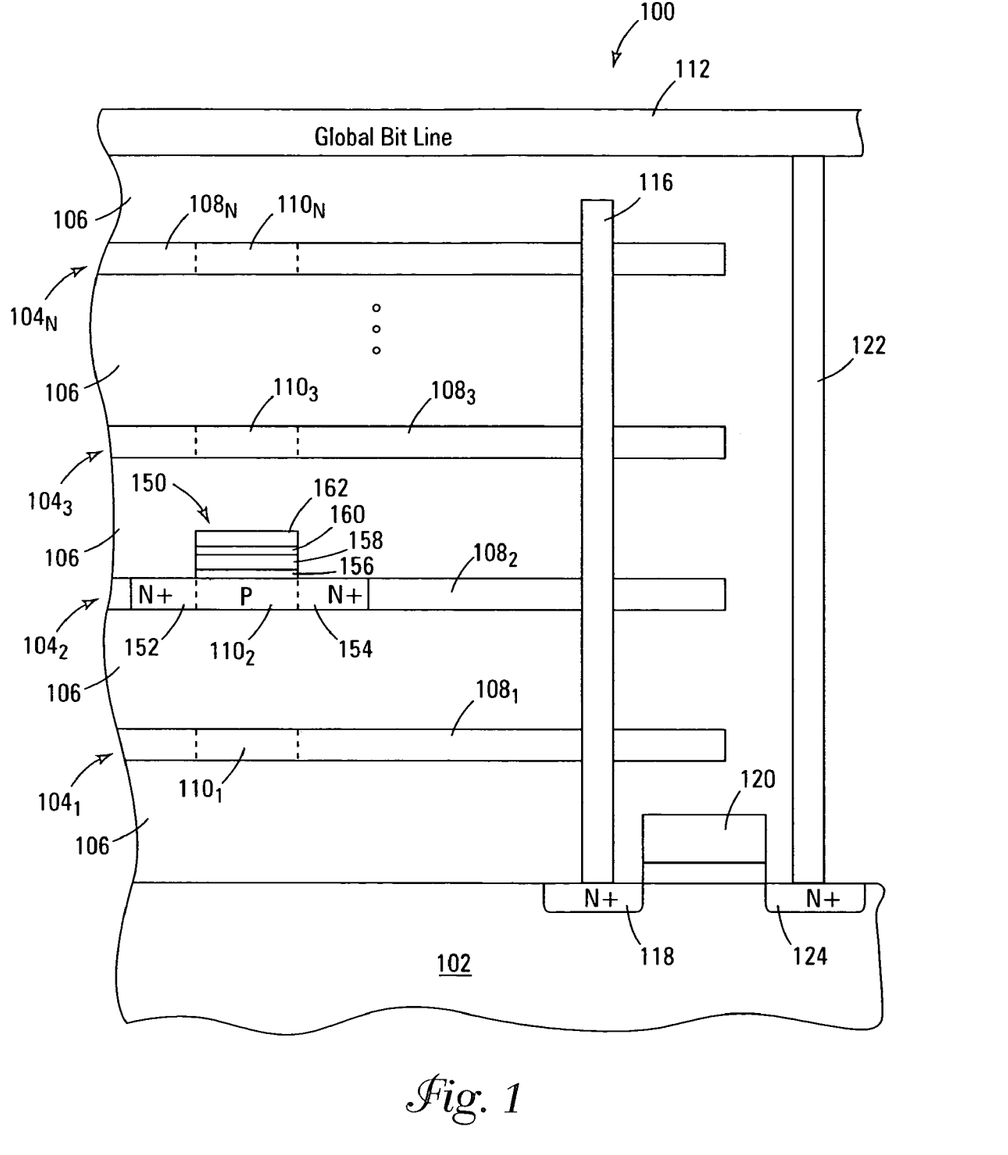
FIGS. 1 and 2 are cross-sectional views taken along substantially perpendicular planes of a multi-layer memory array according to an embodiment of the present invention.
Figure 2:
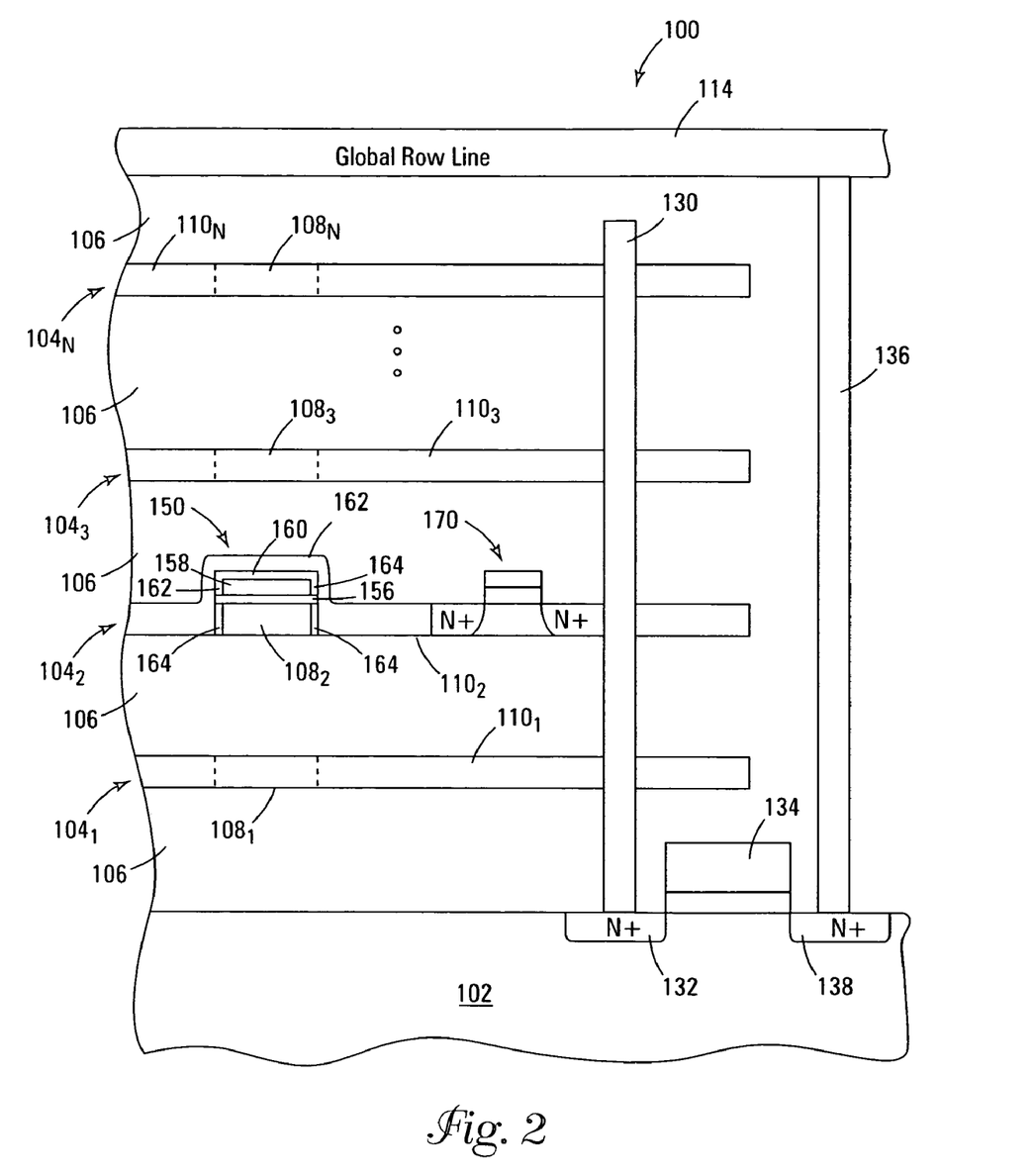

FIGS. 1 and 2 are cross-sectional views taken along substantially perpendicular planes of a multi-layer memory array 100 according to an embodiment of the present invention. Memory array 100 can be a flash memory array, read only memory (ROM) array, a static random access memory (SRAM) array, a silicon-oxide-nitride-oxide-silicon (SONOS) memory array, or the like.

Memory array 100 includes a substrate 102 of silicon or the like. Layers $104_1$ to $104_N$ of a memory material are respectively formed at different levels within memory array. Specifically, layers 104 are formed (or stacked) one above the other on substrate 102. In general, a memory material is any material whose properties can be electrically modified and read to determine whether the properties were modified. Moreover, for some memory materials, the electrically modified properties can be electrically restored to their original sate. Examples of memory materials include silicon, polysilicon, ferroelectric polymers, thin film transistors, etc.

A dielectric layer 106, such as an oxide layer or the like, is formed between successive layers 104 of memory material, separating them from each other. For one embodiment, dielectric layers 106 are a bulk dielectric layers, e.g., of a doped silicate glass, such as BSG (borosilicate glass), PSG (phosphosilicate glass), and BPSG (borophosphosilicate glass).

Specifically, a dielectric layer 106 is formed on substrate 102 and a lowermost layer 104, e.g., layer $104_1$, is formed on that dielectric layer 106. The next dielectric layer 106 is formed on the layer $104_1$, and the next layer of memory material, e.g., layer $104_2$, is formed on that dielectric layer 106 and so on. Each layer 104 is patterned, etched, and processed, e.g., using standard processing, to produce intersecting column lines 108 and row (or word) lines 110. Dashed lines in FIGS. 1 and 2 show the intersections. Memory array 100 further includes a conductive layer (or global bit line) 112 and a conductive layer (or global row line) 114, each formed overlying an uppermost layer 104, e.g., layer $104_N$, as shown in FIGS. 1 and 2.

For one embodiment, an electrical contact 116 electrically contacts each of the layers 104 to electrically interconnect them, as shown in FIG. 1. For another embodiment, electrical contact 116 is an electrically conductive plug that is formed by etching the dielectric layers 106 and layers 104 so that contact 116 penetrates through each of the layers 104. A suitable conductive plug includes a nitride layer, such as titanium nitride (TiN), a first metal layer, such as titanium (Ti), on the nitride layer, and a second metal layer, such as tungsten (W), on the first metal layer. Specifically, a contact 116 passes through and electrically connects corresponding column lines 108 of the respective layers 104. Contact 116 is formed in a first plane containing the column lines 108 that contact 116 passes through, e.g., the plane of FIG. 1. The first plane is substantially perpendicular to a second plane containing row lines 110, e.g., the plane of FIG. 2. For another embodiment, contact 116 is electrically connected to a source/drain region 118 of a select transistor (or gate) 120, such as a field effect transistor (FET), that is formed on substrate 102.

An electrically conductive plug 122 electrically interconnects a source/drain region 124 of select transistor 120 and global bit line 112 in the first plane by passing through the dielectric layers 106 that form a single dielectric layer distally of ends of the layers 104, as shown in FIG. 1. A suitable conductive plug 122 includes a nitride layer, such as titanium nitride (TiN), a first metal layer, such as titanium (Ti), on the nitride layer, and a second metal layer, such as tungsten (W), on the first metal layer. Therefore, each of the column lines 108 is electrically connected to global bit line 112 via select transistor 120 and conductive plug 122.

For one embodiment, an electrical contact 130, located in the second plane, electrically contacts each of the layers 104 to electrically interconnect them in the second plane, as shown in FIG. 2. As such, the second plane contains the column lines 110 that contact 130 passes through. For another embodiment, electrical contact 130 is an electrically conductive plug that is formed by etching the dielectric layers 106 and layers 104 so that contact 130 penetrates through each of the layers 104. Specifically, a contact 130 passes through and electrically connects corresponding row lines 110 of the respective layers 104. For another embodiment, contact 130 is electrically connected to a source/drain region 132 of a select transistor (or gate) 134, such as a field effect transistor (FET), that is formed on substrate 102.

An electrically conductive plug 136, e.g., as described above for conductive plug 122, electrically interconnects a source/drain region 138 of select transistor 134 and global row line 114 in the second plane by passing through the dielectric layers 106 that form a single dielectric layer distally of ends of the layers 104, as shown in FIG. 2. Therefore, each of the row lines 110 is electrically connected to global row line 114 via select transistor 134 and conductive plug 136.

A memory cell 150, such as a non-volatile (or flash memory) cell, an SRAM cell, a ROM cell, etc., is located at each intersection of a column line 108 and a row line 110, as shown in FIGS. 1 and 2 for the intersection of column line $108_2$ and row line $110_2$ of layer $104_2$. As such, each row line 110 contains a row of memory cells 150 and each column line 108 contains a column of memory cells 150 and thus each layer 104 contains an array of memory cells 150. For one embodiment, each memory cell 150 is a floating gate transistor formed on the layer 104, e.g., layer $104_2$, using silicon-on-sapphire (SOS) technology to form an SOS floating gate transistor, silicon-on-insulator (SOI) technology to form an SOI floating gate transistor, thin film transistor (TFT) technology to form a TFT floating gate transistor, thermoelectric polymer technology to form a thermoelectric polymer floating gate transistor, silicon-oxide-nitride-oxide-silicon (SONOS) technology to form a SONOS floating gate transistor, or the like.

The floating gate transistors 150 include a source 152 and a drain 154 (shown in FIG. 1) constructed from an N$^+$-type material of high impurity concentration formed in the layer 104, a P-type semiconductor substrate, e.g., ploysilicon, of low impurity concentration. A tunneling dielectric 156, e.g., a silicon oxide, is formed on the layer 104 at the intersection of the column line 108 and row line 110, as shown in FIGS. 1 and 2. A floating gate 158, e.g., of polysilicon, is formed on tunneling dielectric 156, and an interlayer dielectric 160, e.g., of silicon oxide, nitride, or oxynitride, is formed on floating gate 158, as shown in FIGS. 1 and 2. A control gate 162, e.g., of polysilicon, is formed on interlayer dielectric 160 in electrical contact with the corresponding row line 110, e.g., row line $110_2$, as shown in FIG. 2. Sidewall dielectric spacers 164, e.g., of silicon oxide, nitride or oxynitride, are interposed between a portion of control gate 162 and floating gate 158 for further isolating control gate 162 from floating gate 158, as shown in FIG. 2.

For one embodiment a select transistor (or gate) 170, such as a field effect transistor (FET), is formed on each row line 110 between the memory cells 150 of that row line 110 and the electrical contact 130, as illustrated in FIG. 2 for row line $110_2$. Select transistors 170 enable one row line to be selected at a time, while one of the column lines 108 from each layer 104 is selected. For example, one row line 110 in the second plane is selected, while all of the column lines in the first plane are selected simultaneously. This enables the selection of a single memory cell 150. Specifically, selection of the memory cell 150 at the intersection of column line $108_2$ and row line $110_2$ of layer $104_2$ is accomplished by selecting all of column lines 108 in the first plane simultaneously (i.e., one column line 108 from each layer 104), e.g., by activating select transistor 134, and selecting row line $110_2$ in the second plane by activating the select transistor 170 formed on row line $110_2$. For one embodiment, contact 130 is connected directly to global row line 114, thereby eliminating the need for select transistor 134 and conductive plug 136 when using select transistors 170.

For an alternative embodiment, a select transistor 170 can be formed on each column line 108 between the memory cells 150 of that column line 108 and the electrical contact 116 instead of forming a select transistor 170 on each row line 110. For this embodiment, selection of the memory cell 150 at the intersection of column line $108_2$ and row line $110_2$ of layer $104_2$ is accomplished by selecting one row line 110 from each of layers 104 and selecting column line $108_2$ using the select transistor 170 formed on column line $108_2$. For one embodiment, contact 116 is connected directly to global bit line 112, thereby eliminating the need for select transistor 120 and conductive plug 122 when using select transistors 170.

Figure 3:
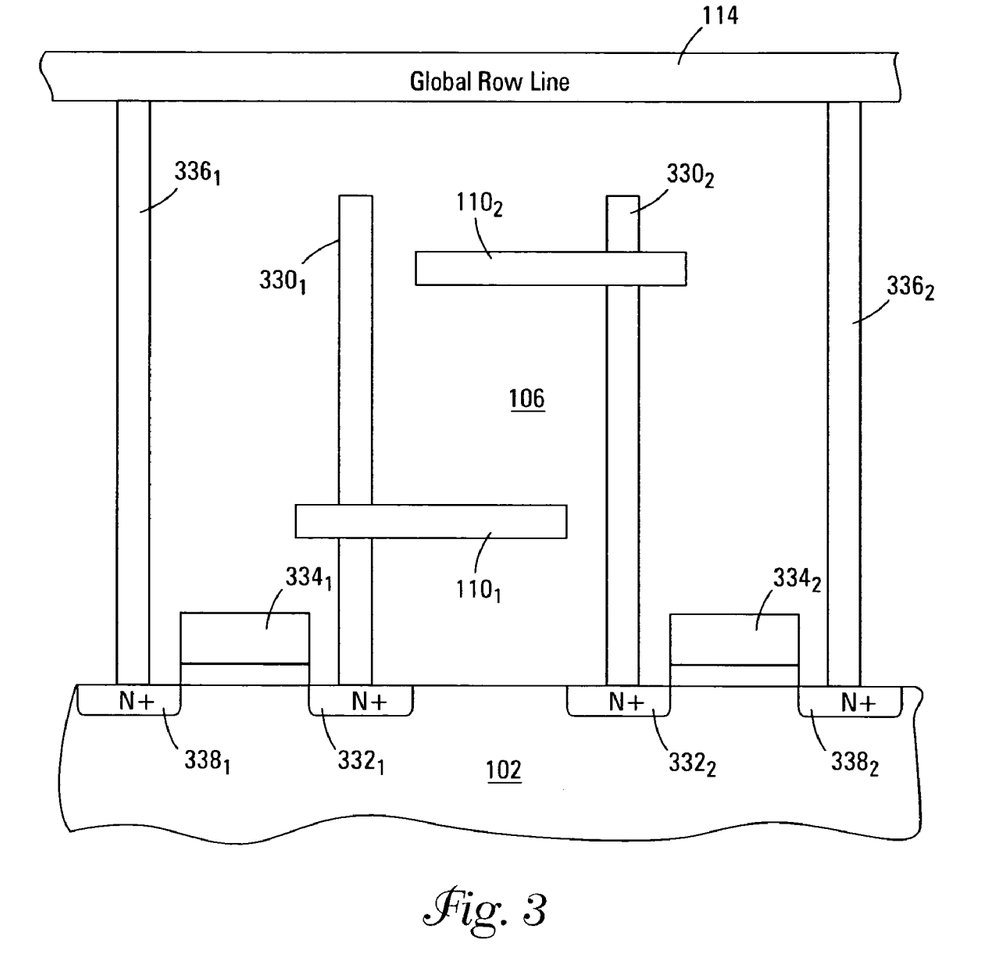
FIG. 3 is a cross-sectional view illustrating row line connections according to another embodiment of the present invention.

FIG. 3 is a cross-sectional view illustrating row line connections according to another embodiment of the present invention. Specifically, FIG. 3 shows an electrical contact $330_1$ penetrating through a single row line 110, e.g., row line $110_1$, and electrically connected thereto so as to electrically interconnect row line $110_1$ and a source/drain region $332_1$ of a select transistor $334_1$. Another electrical contact $330_2$ penetrates through another single row line 110, e.g., row line $110_2$, and is electrically connected thereto so as to electrically interconnect row line $110_2$ and a source/drain region $332_2$ of a select transistor $334_2$. Meanwhile, electrical contact 116 penetrates through each of the column lines 108, e.g., column lines $108_1$ and $108_2$, as shown in FIG. 1, and thus interconnects all of the column lines 108. For one embodiment, electrical contacts 330 are as described for electrical contact 130, and select transistors 334 are as described for select transistor 134.

A conductive plug $336_1$ electrically interconnects a source/drain region $138_1$ of select transistor $334_1$ and the global row line 114. Therefore, row line $110_1$ is electrically connected to global row line 114 via select transistor $334_1$ and conductive plug $336_1$. Another conductive plug $336_2$ electrically interconnects a source/drain region $138_2$ of select transistor $334_2$ and the global row line 114. Therefore, row line $110_2$ is electrically connected to global row line 114 via select transistor $334_2$ and conductive plug $336_2$. For one embodiment, conductive plugs 336 are as described for conductive plug 136. For another embodiment, a select transistor can be formed on row lines $110_1$ and $110_2$ between the memory cells thereon and the respective contacts $336_1$ and $336_2$, enabling contacts 336 to be connected directly to global row line 114, thereby eliminating the need for select transistors 334 and conductive plugs 336.

Using a separate contact 330 for each of row lines $110_1$ and $110_2$ enables individual selection of row line $110_1$ or $110_2$, e.g., using the respective select transistor 334. This enables the selection of a single memory cell 150 when one column line 108 is selected from each layer 104.

For an alternative embodiment, using a separate contact for each of column lines $108_1$ and $108_2$ enables individual selection of column line $108_1$ or $108_2$. This enables the selection of a single memory cell 150 when one of the row lines from each layer 104, e.g., one row line $110_1$ from layer $104_1$ and one row line $110_2$ from layer $104_2$, is interconnected by a single contact and is thus selected.

Figure 4:
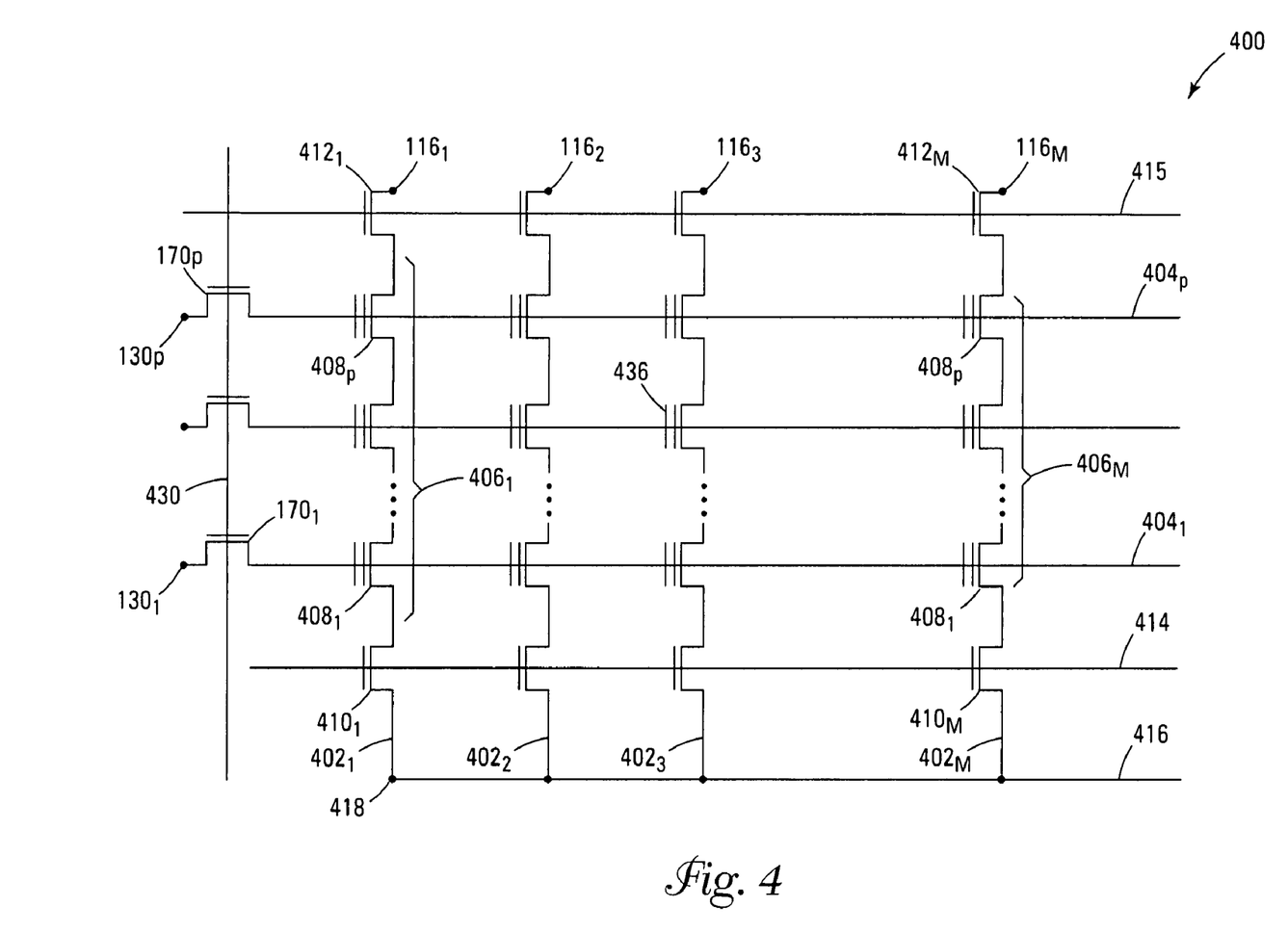
FIG. 4 illustrates a layer of a multi-layer memory array that contains a NAND memory array according to another embodiment of the present invention.

For one embodiment, each layer 104 contains a NAND memory array 400, as shown in FIG. 4 according to another embodiment of the present invention. Memory array 400 includes row (or word) lines $404_1$ to $404_P$ and intersecting column lines $402_1$ to $402_M$. Memory array 400 includes NAND strings $406_1$ to $406_M$. Each NAND string includes floating gate transistors $408_1$ to $408_P$, each located at an intersection of a row line 402 and a column line 404. For one embodiment, the floating gate transistors 408 represent non-volatile memory cells for storage of data. The floating gate transistors 408 of each NAND string 406 are connected in series source to drain between a source select gate (or select transistor) 410, e.g., an FET, and a drain select gate (or select transistor) 412, e.g., an FET. Each source select gate 410 is located at an intersection of a column line 404 and a source select line 414, while each drain select gate 412 is located at an intersection of a column line 404 and a drain select line 415.

For one embodiment, the drain of each drain select gate 412 is connected to a contact 116 for the corresponding NAND string, and in this respect, contact 116 is a bit line contact. Contact 116 is perpendicular to the plane of FIG. 4 and, for some embodiments, interconnects a drain region of a corresponding drain select gate 412 of each of the layers 104 to each other. For example, the drain of a drain select gate $412_1$ in each layer 104 is connected to the contact $116_1$ for the corresponding NAND string $406_1$ of each layer 104. For each layer 104, the source of each drain select gate 412 is connected to the drain of the last floating gate transistor $408_P$ of the corresponding NAND string 406. For example, the source of drain select gate $412_1$ is connected to the drain of floating gate transistor $408_P$ of the corresponding NAND string $406_1$. Connecting column lines 402 to contacts 116 via drain select gates 412 enables contact 116 to be connected directly to global bit line 112, thereby eliminating the need for the select transistor 120 and the conductive plug 122 of FIG. 1.

A source of each source select gate 410 is connected to a common source line 416. For one embodiment, a source line contact 418 that is perpendicular to the plane of FIG. 4 interconnects a common source line 416 of each of the layers 104 to each other. For this embodiment, source contact 418 passes through each of the layers 104, as is shown for contact 116 in FIG. 1, and can be formed as a conductive plug as described above for contact 116. For each layer 104, the drain of each source select gate 410 is connected to the source of the first floating gate transistor 408 of the corresponding NAND string 406. For example, the drain of source select gate $410_1$ is connected to the source of floating gate transistor $408_1$ of the corresponding NAND string $406_1$.

A control gate 420 of each source select gate 410 is connected to source select line 414.

For another embodiment, a contact 130 is connected to each of row lines 404, and a select transistor 170 is connected between each contact 130 and a first of the floating gate transistors 408 of each row line 404. Contact 130 is perpendicular to the plane of FIG. 4 and, for some embodiments, interconnects corresponding row lines of each of the layers 104. For example, a row line $404_1$ in each layer 104 is connected to the contact $130_1$. In this respect, contact 130 is a word line contact. A control line 430 interconnects select transistors 170, as shown in FIG. 4, for activating select transistors 170 substantially simultaneously.

Floating gate transistors 408 have their control gates 436 coupled to a row (or word) line 404 that is connected to a given word line contact 130. A column of the floating gate transistors 408 is a NAND string 406 connected to a given bit line contact 116.

Figure 5:
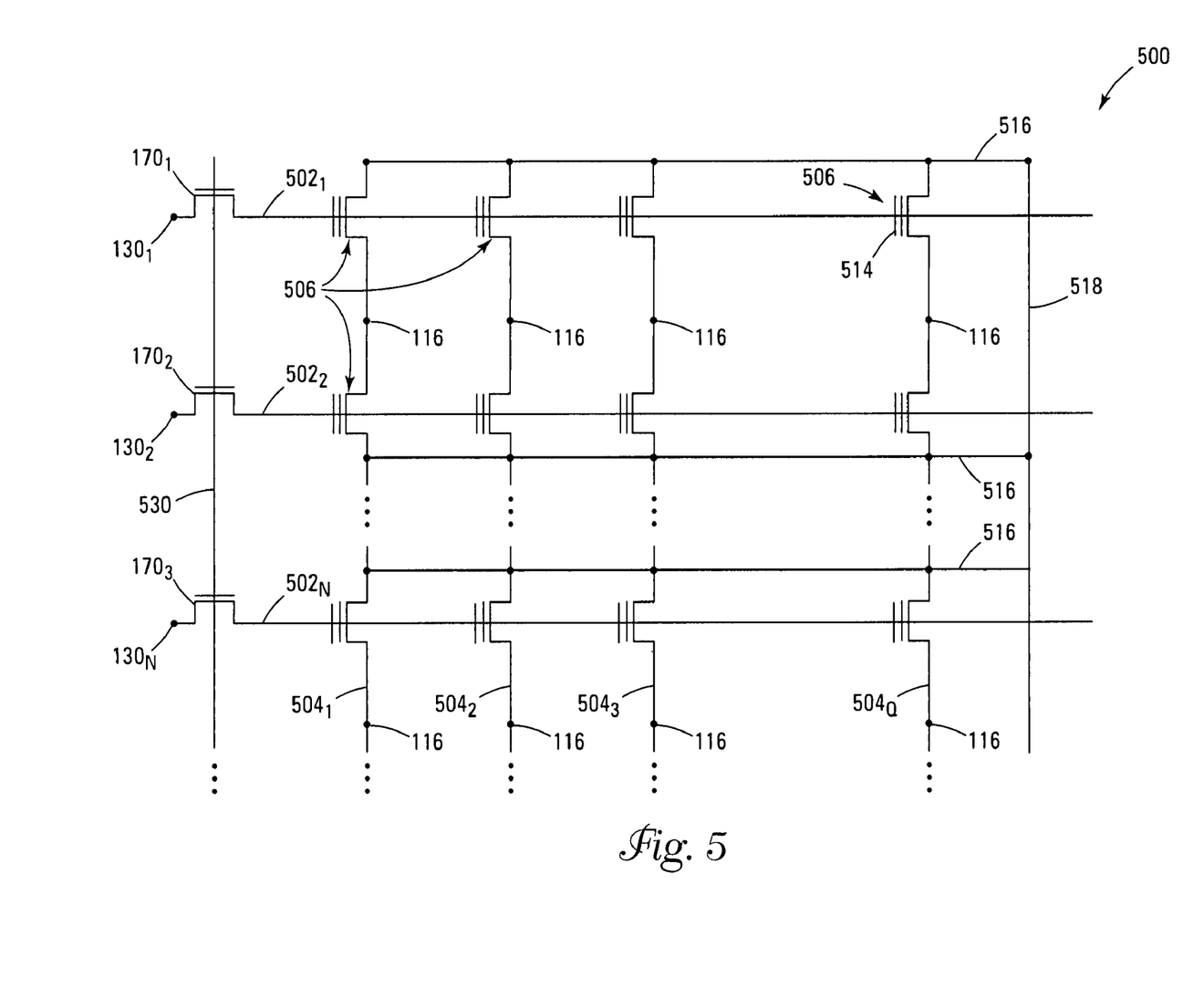
FIG. 5 illustrates a layer of a multi-layer memory array that contains a NOR memory array according to another embodiment of the present invention.

For another embodiment, each layer 104 contains a NOR memory array 500, as shown in FIG. 5 according to another embodiment of the present invention. As shown in FIG. 5, memory array 500 includes row (or word) lines $502_1$ to $502_N$ and intersecting column lines $504_1$ to $504_Q$. Floating gate transistors 506 are located at each intersection of a row line 502 and a column line 504. For one embodiment, floating gate transistors 506 represent non-volatile memory cells for storage of data.

For one embodiment, an adjacent pair of floating gate transistors 506 has a common drain region therebetween that is connected to a contact (or bit-line contact) 116, as shown in FIG. 5. Contact 116 is perpendicular to the plane of FIG. 5 and, for some embodiments, interconnects a corresponding common drain region of each of the layers 104 to each other. A column of the floating gate transistors 506 are those transistors located on a given column line 504. A row of the floating gate transistors 506 are those transistors commonly connected to a given word line 502.

For another embodiment, a contact 130 is connected to each of the row lines 502, and a select transistor 170 is connected between each contact 130 and a first of the floating gate transistors 506 of each row line 502. Contact 130 is perpendicular to the plane of FIG. 5 and, for some embodiments, interconnects corresponding row lines of each of the layers 104. For example, a row line $502_1$ in each layer 104 is connected to the contact $130_1$. Floating gate transistors 506 have their control gates 514 coupled to a row (or word) line 502 that is connected to a given word line contact 130. A control line 530 interconnects select transistors 170, as shown in FIG. 5, for activating select transistors 170 substantially simultaneously.

As shown in FIG. 5, floating gate transistors 506 connected to two adjacent row lines 502 may share the same array source 516. To reduce problems associated with high resistance levels in array sources 516, array sources 516 are regularly connected to a metal or other highly conductive line to provide a low-resistance path to ground. The array ground 518 serves as this low-resistance path.

Figure 6:
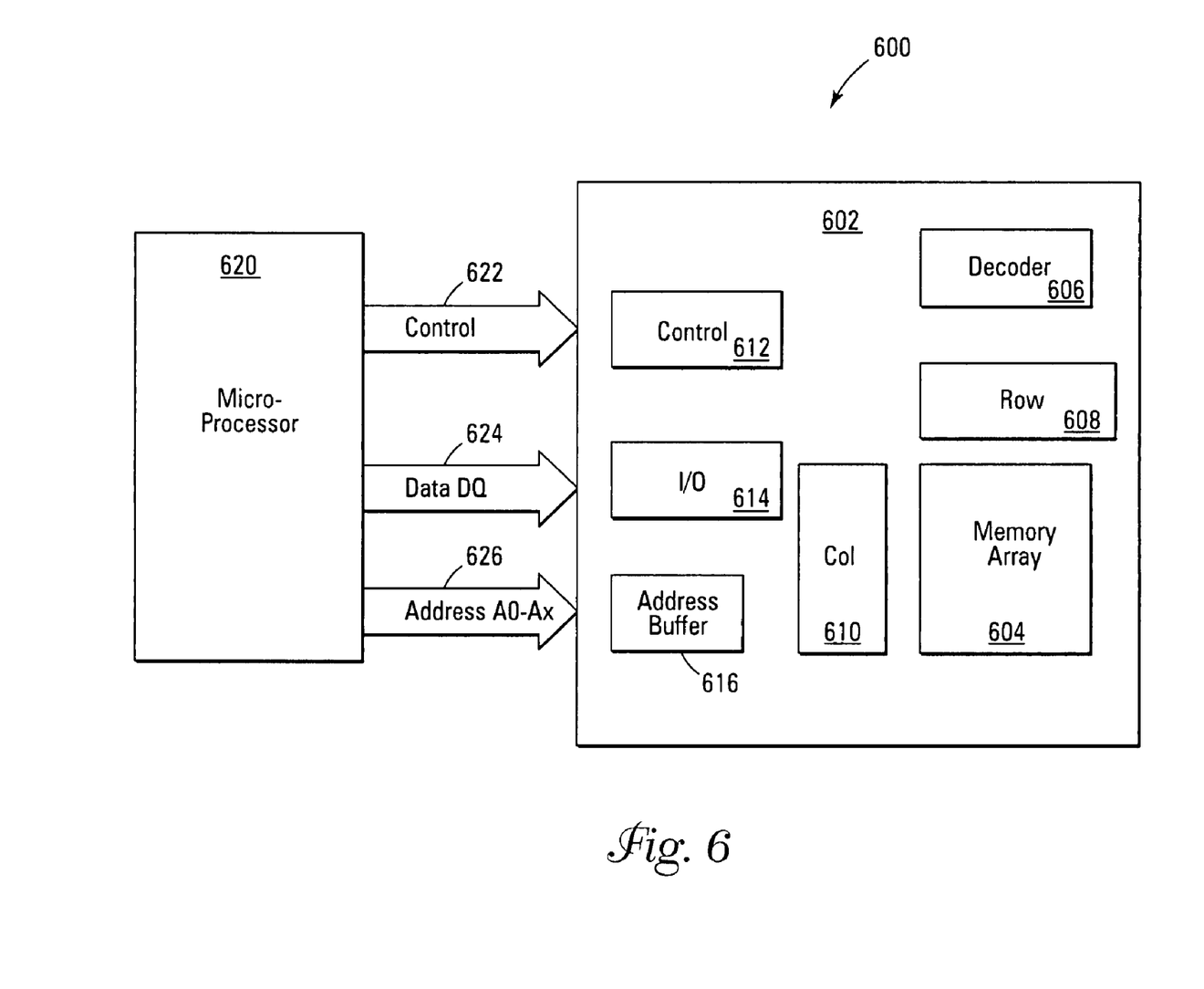
FIG. 6 is a simplified block diagram of a memory system according to another embodiment of the present invention.

FIG. 6 is a simplified block diagram of a memory system 600 according to another embodiment of the present invention. Memory system 600 includes an integrated circuit memory device 602 that includes an array 604 of memory cells, an address decoder 606, row access circuitry 608, column access circuitry 610, control circuitry 612, Input/Output (I/O) circuitry 614, and an address buffer 616. Memory system 600 includes an external microprocessor 620, or memory controller, electrically connected to memory device 602 for memory accessing as part of an electronic system. The memory device 602 receives control signals from the processor 620 over a control link 622. The memory cells are used to store data that are accessed via a data (DQ) link 624. Address signals are received via an address link 626 that are decoded at address decoder 606 to access the memory array 604. Address buffer circuit 616 latches the address signals. The memory cells are accessed in response to the control signals and the address signals. It will be appreciated by those skilled in the art that additional circuitry and control signals can be provided, and that the memory device of FIG. 6 has been simplified to help focus on the invention. The array of memory cells 604 is formed in accordance with the present invention.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. For example, the present invention is applicable to any memory array having lines of a memory material that are crossed by lines of another or the same memory material, such as a transistor matrix, resistor matrix, etc. Accordingly, this application is intended to cover any adaptations or variations of the invention. It is manifestly intended that this invention be limited only by the following claims and equivalents thereof.

What is claimed is:

1. A memory array comprising:
   two or more layers of memory material, each layer of memory material comprising an array of memory cells;
   a first contact penetrating through each layer of memory material in a first plane and electrically connected to each layer of memory material so as to electrically interconnect the layers of memory material in the first plane; and
   a second contact penetrating through each of the layers of memory material in a second plane substantially perpendicular to the first plane so as to electrically interconnect the layers of memory material in the second plane.

2. The memory array of claim 1, further comprising a dielectric layer disposed between successive layers of memory material.

3. The memory array of claim 1, further comprising:
   a select transistor disposed on a substrate of the memory array below the layers of memory material; and
   a conductive plug connecting a first source/drain region of the select transistor to a conductive layer located above the layers of memory material, wherein a second source/drain region of the select transistor is connected to the second contact.

4. The memory array of claim 1, further comprising a select transistor disposed on each layer of memory material between the memory cells and the second contact.

5. The memory array of claim 1, further comprising:
   a third contact penetrating through another of the layers of memory material in the second plane and electrically connected thereto.

6. The memory array of claim 5, further comprising:
   first and second select transistors disposed on a substrate of the memory array below the layers of memory material;
   a first conductive plug connecting a first source/drain region of the first select transistor to a conductive layer located above the layers of memory material, wherein a second source/drain region of the first select transistor is connected to the second contact; and
   a second conductive plug connecting a first source/drain region of the second select transistor to the conductive layer located above the layers of memory material, wherein a second source/drain region of the second select transistor is connected to the third contact.

7. The memory array of claim 1, wherein each of the memory cells is a floating gate transistor.

8. The memory array of claim 1, wherein each of the memory cells is a silicon-on-sapphire transistor, silicon-on-insulator transistor, thin film transistor, thermoelectric polymer transistor, or silicon-oxide-nitride-oxide-silicon transistor.

9. The memory array of claim 1, wherein each array of memory cells is a NAND flash memory array or a NOR flash memory array.

10. The memory array of claim 1, wherein the memory array is a read only memory array or a static random access memory array.

11. The memory array of claim 1, wherein the layers of memory material comprise polysilicon.

12. A memory array comprising:
    two or more layers of memory material, each layer of memory material comprising an array of memory cells;
    a first contact penetrating through each layer of memory material in a first plane and electrically connected to each layer of memory material so as to electrically interconnect the layers of memory material in the first plane;
    a select transistor disposed on a substrate of the memory array below the layers of memory material; and
    a conductive plug connecting a first source/drain region of the select transistor to a conductive layer located above the layers of memory material, wherein a second source/drain region of the select transistor is connected to the first contact.

13. A memory array comprising:
    a plurality of layers of memory material, each layer of memory material containing an array of memory cells arranged in rows and columns and each of the plurality of layers of memory material separated from each other by a dielectric material;
    a plurality of first contacts passing through each of the plurality of layers of memory material, each first contact in electrical communication with at least one memory cell of a column of memory cells in each of the plurality of layers of memory material;
    a plurality of second contacts passing through each of the plurality of layers of memory material, each second contact in selective electrical communication with a row of memory cells in each of the plurality of layers of memory material; and
    a plurality of first select transistors, each first select transistor connected between a second contact and its respective row of memory cells for providing selective electrical communication, the plurality of first select transistors adapted to provide electrical communication with only one row of memory cells for each second contact.

14. The memory array of claim 13, further comprising for each first contact:
  one second select transistor disposed on a substrate of the memory array below the layers of memory material; and
  one first conductive plug passing through the memory array and connecting a first source/drain region of the second select transistor to a global bit line located above the layers of memory material, wherein a second source/drain region of the second select transistor is connected to the first contact.

15. The memory array of claim 14, further comprising for each second contact:
  one third select transistor disposed on the substrate below the layers of memory material; and
  one second conductive plug connecting a first source/drain region of the third select transistor to a global row line located above the layers of memory material, wherein a second source/drain region of the third select transistor is connected to the second contact.

16. The memory array of claim 13, wherein each of the memory cells is a flash memory cell.

17. The memory array of claim 13, wherein each of the memory cells is a silicon-on-sapphire transistor, silicon-on-insulator transistor, thin film transistor, thermoelectric polymer transistor, or silicon-oxide-nitride-oxide-silicon transistor.

18. The memory array of claim 13, wherein the array of memory cells of each layer of memory material is a NAND flash memory array or a NOR flash memory array.

19. The memory array of claim 13, wherein the memory array is a read only memory array or a static random access memory array.

20. The memory array of claim 13, further comprising a plurality of second select transistors, each second select transistor connected between a first contact and its respective column of memory cells for providing selective electrical communication, wherein each first contact is connected directly to a global bit line located above the layers of memory material.

21. The memory array of claim 13, wherein each second contact is connected directly to a global row line located above the layers of memory material.

22. The memory array of claim 13, wherein each first contact electrically connects NAND strings of the respective layers of memory material.

23. The memory array of claim 13, wherein each first contact electrically connects drain regions of memory cells of the respective layers of memory material.

24. A memory array comprising:
  a plurality of layers of memory material, each layer of memory material containing an array of memory cells arranged in rows and columns and each of the plurality of layers of memory material separated from each other by a dielectric material;
  a plurality of first contacts passing though each of the plurality of layers of memory material, each first contact in electrical communication with at least one memory cell of a row of memory cells in each of the plurality of layers of memory material;
  a plurality of second contacts passing though each of the plurality of layers of memory material, each second contact in selective electrical communication with a column of memory cells in each of the plurality of layers of memory material; and
  a plurality of first select transistors, each first select transistor connected between a second contact and its respective column of memory cells for providing selective electrical communication, the plurality of first select transistors adapted to provide electrical communication with only one column of memory cells for each second contact.

25. The memory array of claim 24, further comprising for each first contact:
  one second select transistor disposed on a substrate of the memory array below the layers of memory material; and
  one first conductive plug connecting a first source/drain region of the second select transistor to a global row line located above the layers of memory material, wherein a second source/drain region of the second select transistor is connected to the first contact.

26. The memory array of claim 25, further comprising for each second contact:
  one third select transistor disposed on the substrate below the layers of memory material; and
  one second conductive plug connecting a first source/drain region of the third select transistor to a global bit line located above the layers of memory material, wherein a second source/drain region of the third select transistor is connected to the second contact.

27. The memory array of claim 24, further comprising a plurality of second select transistors, each second select transistor connected between a first contact and its respective row of memory cells for providing selective electrical communication, wherein each first contact is connected directly to a global row line located above the layers of memory material.

28. The memory array of claim 24, wherein each second contact is connected directly to a global bit line located above the layers of memory material.

29. The memory array of claim 24, wherein each of the memory cells is a flash memory cell.

30. The memory array of claim 24, wherein each of the memory cells is a silicon-on-sapphire transistor, silicon-on-insulator transistor, thin film transistor, thermoelectric polymer transistor, or silicon-oxide-nitride-oxide-silicon transistor.

31. The memory array of claim 24, wherein the array of memory cells of each layer of memory material is a NAND flash memory array or a NOR flash memory array.

32. The memory array of claim 24, wherein the memory array is a read only memory array or a static random access memory array.

33. The memory array of claim 24, wherein the second contact electrically connects NAND strings of the respective layers of memory material.

34. The memory array of claim 24, wherein the second contact electrically connects drain regions of memory cells of the respective layers of memory material.

35. A memory device comprising:
  a multi-layer memory array, wherein the array comprises:
    a plurality of layers of memory material, each layer of memory material containing an array of memory cells arranged in rows and columns and each of the plurality of layers of memory material separated from each other by a dielectric material;
    a plurality of first contacts passing through each of the plurality of layers of memory material, each first contact in electrical communication with at least one memory cell of a column of memory cells in each of the plurality of layers of memory material;
    a plurality of second contacts passing through each of the plurality of layers of memory material, each second contact in selective electrical communication with a row of memory cells in each of the plurality of layers of memory material;

a plurality of first select transistors, each first select transistor connected between a second contact and its respective row of memory cells for providing selective electrical communication, the plurality of first select transistors adapted to provide electrical communication with only one row of memory cells for each second contact; and a plurality of global bit lines and global row lines above the layers of memory material, each global bit line in electrical communication with at least one of the first contacts and each global row line in electrical communication with at least one of the second contacts;

column access circuitry connected to the plurality of global bit lines; and row access circuitry connected to the plurality of global row lines.

36. A memory device comprising:

a multi-layer memory array, wherein the array comprises:

a plurality of layers of memory material, each layer of memory material containing an array of memory cells arranged in rows and columns and each of the plurality of layers of memory material separated from each other by a dielectric material;

a plurality of first contacts passing through each of the plurality of layers of memory material, each first contact in electrical communication with at least one memory cell of a row of memory cells in each of the plurality of layers of memory material;

a plurality of second contacts passing through each of the plurality of layers of memory material, each second contact in selective electrical communication with a column of memory cells in each of the plurality of layers of memory material;

a plurality of first select transistors, each first select transistor connected between a second contact and its respective column of memory cells for providing selective electrical communication, the plurality of first select transistors adapted to provide electrical communication with only one column of memory cells for each second contact; and a plurality of global bit lines and global row lines above the layers of memory material, each global bit line in electrical communication with at least one of the second contacts and each global row line in electrical communication with at least one of the first contacts;

column access circuitry connected to the plurality of global bit lines; and row access circuitry connected to the plurality of global row lines.

37. An electronic system comprising:

a processor;

a memory device connected to the processor, the memory device comprising:

a multi-layer memory array, wherein the memory array comprises:

a plurality of layers of memory material, each layer of memory material containing an array of memory cells arranged in rows and columns and each of the plurality of layers of memory material separated from each other by a dielectric material;

a plurality of first contacts passing through each of the plurality of layers of memory material, each first contact in electrical communication with at least one memory cell of a column of memory cells in each of the plurality of layers of memory material;

a plurality of second contacts passing through each of the plurality of layers of memory material, each second contact in selective electrical communication with a row of memory cells in each of the plurality of layers of memory material;

a plurality of first select transistors, each first select transistor connected between a second contact and its respective row of memory cells for providing selective electrical communication, the plurality of first select transistors adapted to provide electrical communication with only one row of memory cells for each second contact; and a plurality of global bit lines and global row lines above the layers of memory material, each global bit line in electrical communication with at least one of the first contacts and each global row line in electrical communication with at least one of the second contacts;

column access circuitry connected to the plurality of global bit lines; and row access circuitry connected to the plurality of global row lines.

38. An electronic system comprising:

a processor;

a memory device connected to the processor, the memory device comprising:

a multi-layer memory array, wherein the memory array comprises:

a plurality of layers of memory material, each layer of memory material containing an array of memory cells arranged in rows and columns and each of the plurality of layers of memory material separated from each other by a dielectric material;

a plurality of first contacts passing through each of the plurality of layers of memory material, each first contact in electrical communication with at least one memory cell of a row of memory cells in each of the plurality of layers of memory material;

a plurality of second contacts passing through each of the plurality of layers of memory material, each second contact in selective electrical communication with a column of memory cells in each of the plurality of layers of memory material;

a plurality of first select transistors, each first select transistor connected between a second contact and its respective column of memory cells for providing selective electrical communication, the plurality of first select transistors adapted to provide electrical communication with only one column of memory cells for each second contact; and a plurality of global bit lines and global row lines above the layers of memory material, each global bit line in electrical communication with at least one of the second contacts and each global row line in electrical communication with at least one of the first contacts;

column access circuitry connected to the plurality of global bit lines; and row access circuitry connected to the plurality of global row lines.

* * * * *